(12) United States Patent
Redaelli

(10) Patent No.: US 9,691,475 B2
(45) Date of Patent: Jun. 27, 2017

(54) CONSTRUCTIONS COMPRISING STACKED MEMORY ARRAYS

(71) Applicant: Micron Technology, Inc., Boise, ID (US)

(72) Inventor: Andrea Redaelli, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 14/662,920

(22) Filed: Mar. 19, 2015

(65) Prior Publication Data

US 2016/0276022 A1 Sep. 22, 2016

(51) Int. Cl.
*G11C 13/00* (2006.01)

(52) U.S. Cl.
CPC ........ *G11C 13/0004* (2013.01); *G11C 13/003* (2013.01); *G11C 13/0023* (2013.01); *G11C 2213/71* (2013.01)

(58) Field of Classification Search
CPC ............................ G11C 13/0004; G11C 13/003
See application file for complete search history.

(56) References Cited

U.S. PATENT DOCUMENTS

| | | | |
|---|---|---|---|
| 6,327,169 B1 * | 12/2001 | Choy | G11O 5/063 365/51 |
| 6,344,994 B1 * | 2/2002 | Hamilton | G11O 5/063 257/316 |
| 6,768,661 B2 | 7/2004 | Vyvoda et al. | |
| 7,256,126 B1 * | 8/2007 | Chen | H01L 21/0337 257/E21.645 |
| 7,558,100 B2 * | 7/2009 | Ahn | G11C 11/5678 365/148 |
| 7,894,238 B2 * | 2/2011 | Shinozaki | H01L 27/24 365/130 |
| 8,410,617 B2 | 4/2013 | Leedy | |
| 8,536,561 B2 | 9/2013 | Sills et al. | |
| 8,716,084 B2 | 5/2014 | Bicksler et al. | |
| 8,921,960 B2 | 12/2014 | Yang et al. | |
| 2004/0160848 A1 | 8/2004 | Rinerson et al. | |
| 2008/0105878 A1 | 5/2008 | Ohara | |
| 2008/0273363 A1 | 11/2008 | Mouli | |

(Continued)

FOREIGN PATENT DOCUMENTS

WO PCT/US2015/067264 6/2016

*Primary Examiner* — Tri Hoang
(74) *Attorney, Agent, or Firm* — Wells St. John P.S.

(57) ABSTRACT

Some embodiments include a construction having a first memory array deck and a second memory array deck over the first memory array deck. The second memory array deck differs from the first memory array deck in one or more operating characteristics, in pitch, and/or in one or more structural parameters; with the structural parameters including different materials and/or different thicknesses of materials. Some embodiments include a construction having a first series and a third series of access/sense lines extending along a first direction, and a second series of access/sense lines between the first and third series and extending along a second direction which crosses the first direction. First memory cells are between the first and second series of access/sense lines and arranged in a first memory array deck. Second memory cells are between the second and third series of access/sense lines and arranged in a second memory array deck.

14 Claims, 8 Drawing Sheets

(56) References Cited

U.S. PATENT DOCUMENTS

| | | |
|---|---|---|
| 2010/0237320 A1 | 9/2010 | Nagashima |
| 2013/0181183 A1 | 7/2013 | Pellizzer et al. |
| 2013/0256625 A1 | 10/2013 | Lee |
| 2014/0374686 A1 | 12/2014 | Pangal et al. |
| 2015/0028280 A1* | 1/2015 | Sciarrillo ............... H01L 45/04 257/4 |
| 2015/0214479 A1* | 7/2015 | Lung ..................... H01L 45/06 365/163 |
| 2016/0133603 A1* | 5/2016 | Ahn ..................... G11O 5/063 365/63 |
| 2016/0267946 A1* | 9/2016 | Ahn ..................... H01L 23/48 |

\* cited by examiner

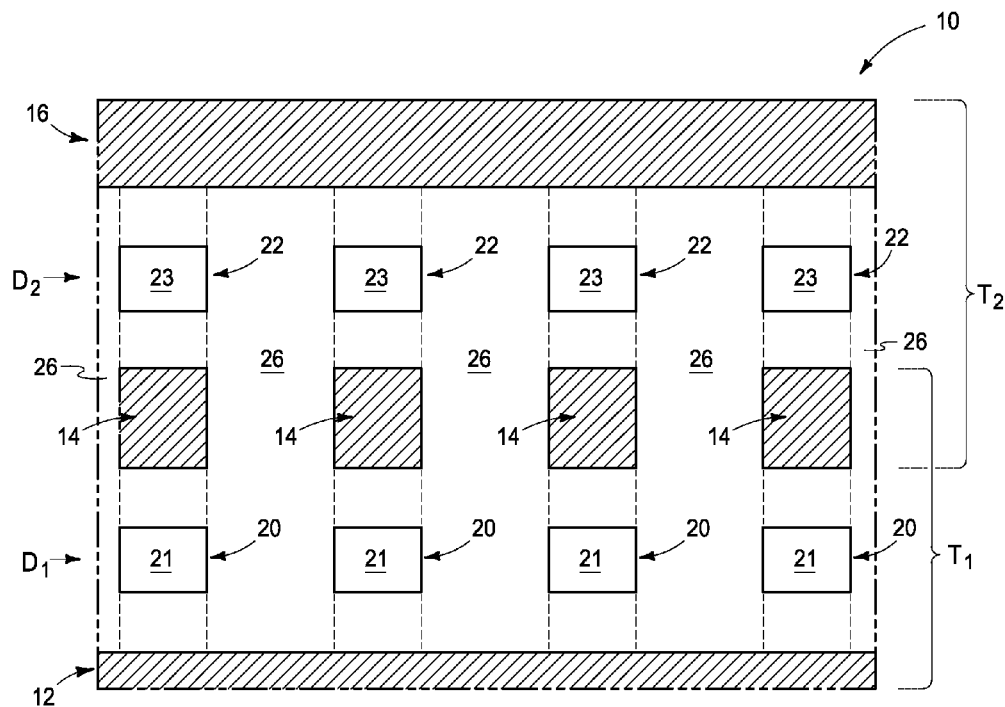
FIG. 1A (x-x)
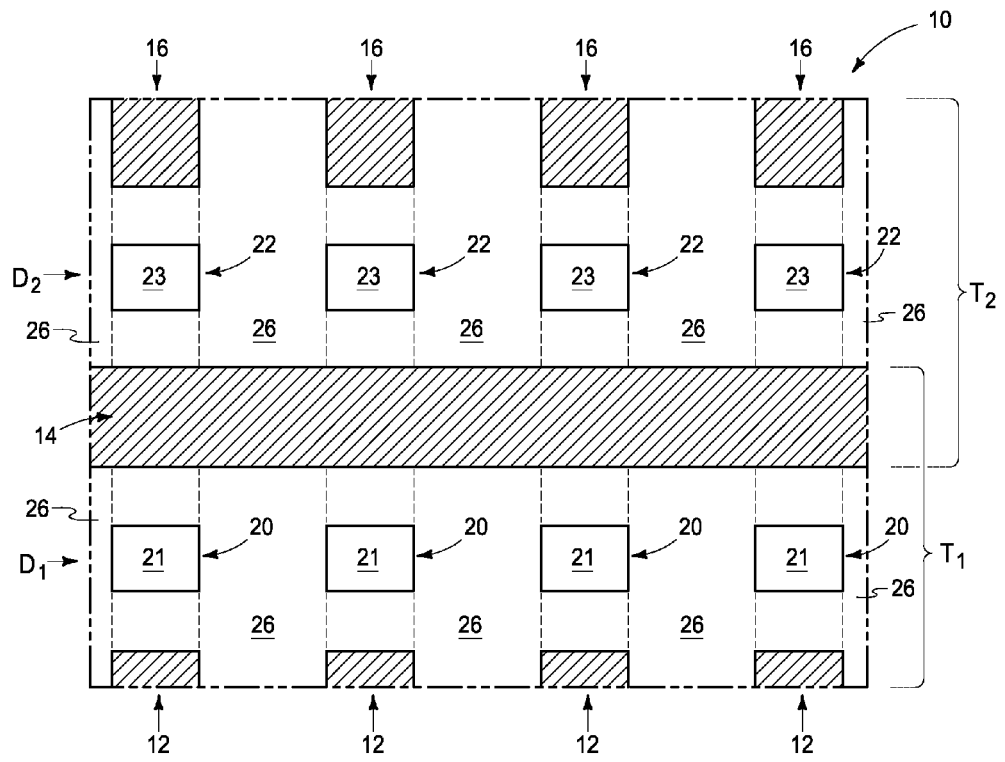
FIG. 1B (y-y)

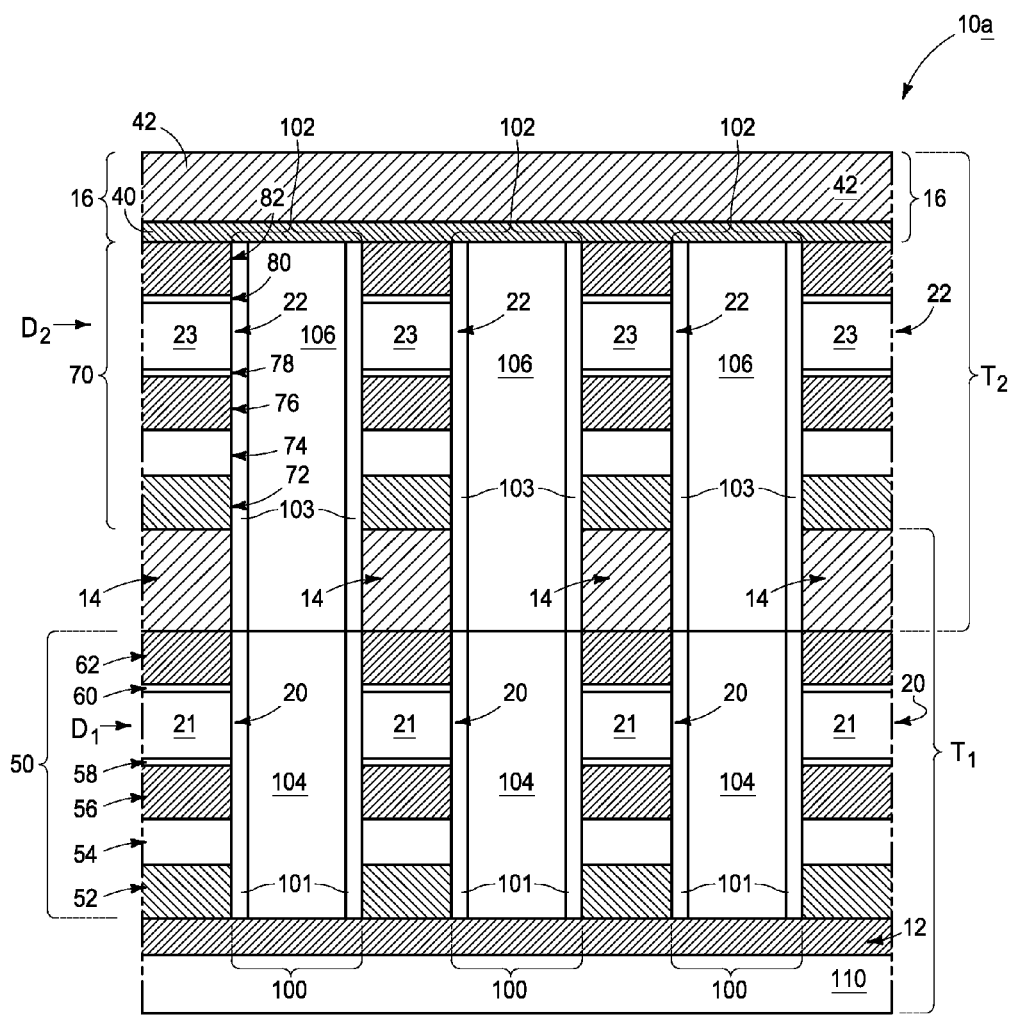
FIG. 6A (x-x)

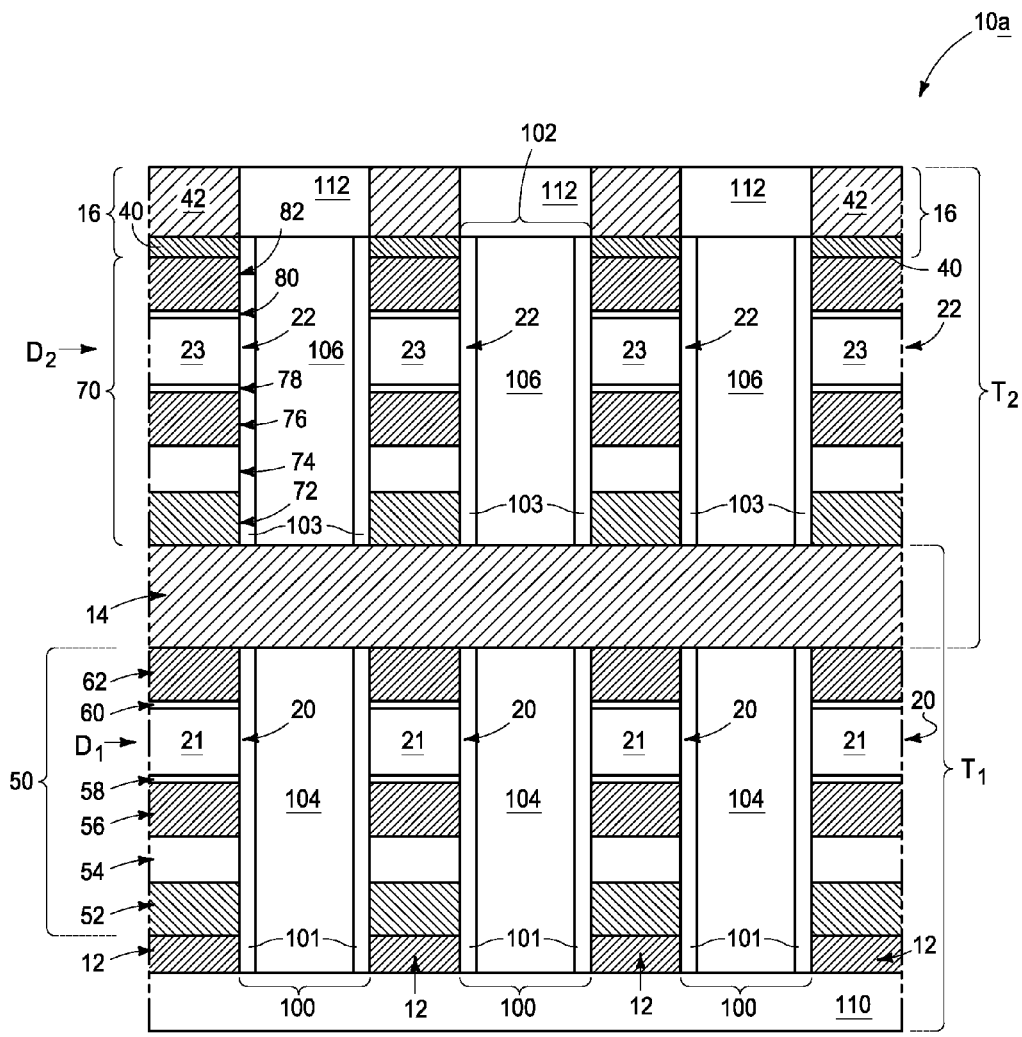
FIG. 6B (y-y)

CONSTRUCTIONS COMPRISING STACKED MEMORY ARRAYS

TECHNICAL FIELD

Constructions comprising stacked memory arrays.

BACKGROUND

Memory is one type of integrated circuitry, and is used in systems for storing data. Memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. Accordingly, there has been substantial interest in three-dimensional cross-point memory. Example three-dimensional cross-point memory cells may utilize phase change material (e.g., chalcogenide) as a two-state material suitable for storing a memory bit.

It would be desirable to develop improved memory arrays, and improved methods of forming memory arrays.

BRIEF DESCRIPTION OF THE DRAWINGS

FIGS. 1, 1A and 1B are a top view and cross-sectional side views of a portion of an example embodiment construction. FIGS. 1A and 1B are along the lines 1A-1A and 1B-1B, respectively, of FIG. 1.

FIGS. 6A and 6B are cross-sectional side views of a portion of an example embodiment construction.

DETAILED DESCRIPTION OF THE ILLUSTRATED EMBODIMENTS

Some embodiments include architectures in which two or more memory array decks are vertically stacked. One or more of the stacked decks is configured to have different operational characteristics relative to others of the stacked decks. For instance, one or more of the decks may be configured to have rapid access times suitable for utilization in XIP (execute in place) applications and/or dynamic random access memory (DRAM) emulation applications, and one or more others of the decks may be configured to have stabile, possibly slower access, storage suitable for utilization in long-term storage applications. Further, one or more of the decks may be configured to have more endurance than others of the decks. For instance, one or more of the decks may be suitable for a lifetime of approximately 100,000 cycles, whereas one or more others of the decks may be suitable for about 1,000,000 cycles (in other words, at least one of the decks may have a durability of at least about 10-fold more cycling times than another of the decks). The difference between the endurance of the decks may result from structural differences between the decks. For instance, a deck with higher endurance may have reduced thermal disturb and/or other memory-loss mechanisms as compared to a deck with less endurance. However, the deck with less endurance may have other advantages (for instance, faster access times, etc.) as compared to the deck with higher endurance. Accordingly, each memory array deck may be tailored for applicability relative to specific memory functions.

Example embodiments are described below with reference to FIGS. 1-8.

Figure 1:
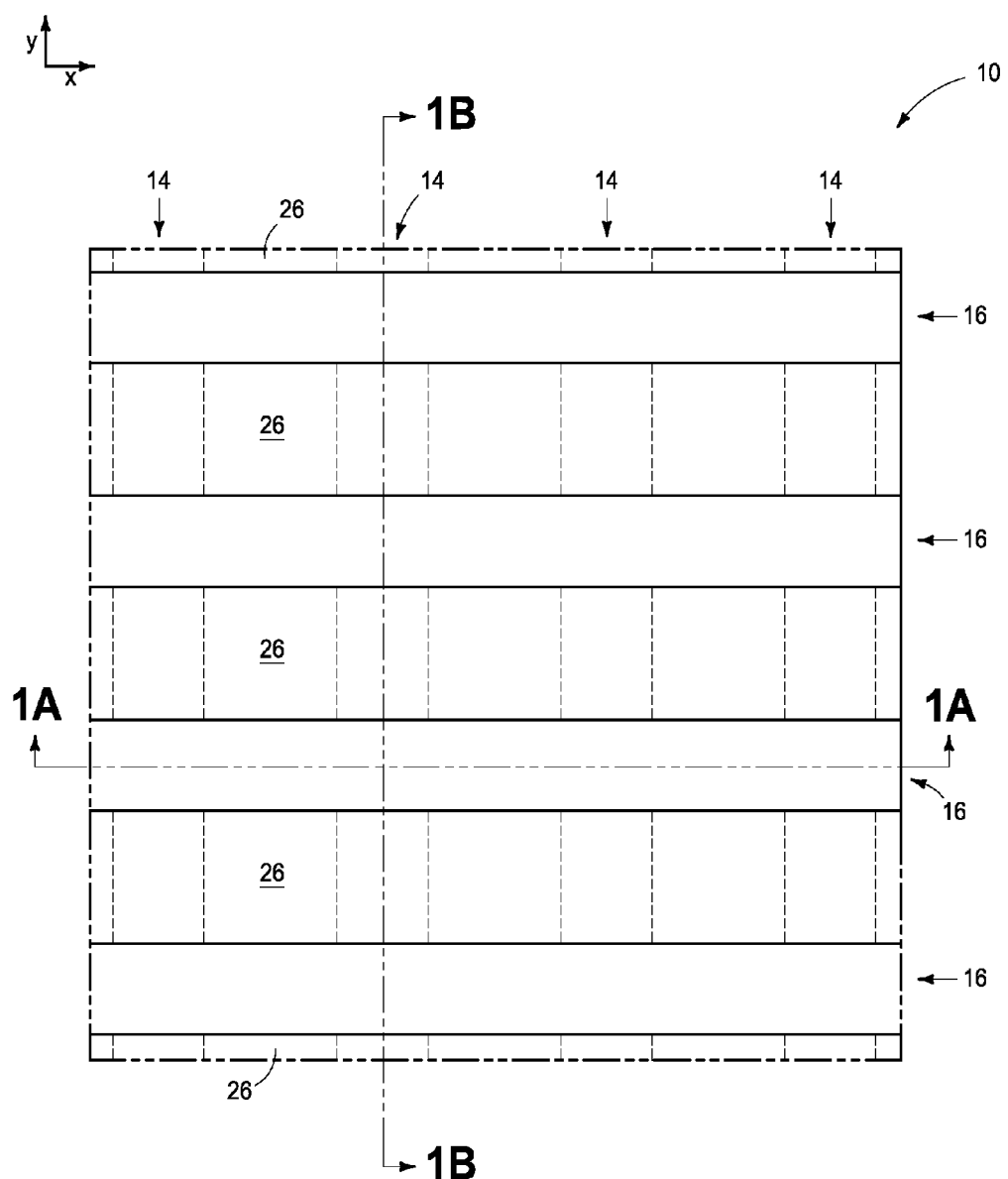

Referring to FIGS. 1, 1A and 1B, a construction 10 is shown in top view (FIG. 1) and cross-sectional side views (FIGS. 1A and 1B) to illustrate example architecture. An axis system is shown proximate the top view of FIG. 1, with such system illustrating an x-axis and orthogonal y-axis. The cross-sectional view of FIG. 1A is along the x-axis, and that of FIG. 1B is along the y-axis.

The cross-sectional views of FIGS. 1A and 1B shows that the architecture comprises three series of access/sense lines. A bottom series (i.e., first series) comprises access/sense lines 12, a middle series (i.e., second series) comprises access/sense lines 14, and an upper series (i.e., third series) comprises access/sense lines 16. The access/sense lines 12, 14 and 16 may comprise the same compositions as one another in some embodiments, or may comprise different compositions relative to one another in other embodiments. Any suitable electrically conductive material may be utilized for the access/sense lines 12, 14 and 16. In some embodiments, the access/sense lines may comprise metal or metal-containing compositions; such as, for example, tungsten, titanium, tungsten nitride, titanium nitride, tungsten silicide, titanium silicide, etc. In some embodiments, the access/sense lines 12, 14 and 16 may be a same thickness as one another, and in other embodiments at least one of the access/sense lines may be a different thickness relative to another of the access/sense lines.

The access/sense lines may correspond to wordlines and bitlines. For instance, lines 12 and 16 may correspond to wordlines, and lines 14 may correspond to bitlines.

In the shown embodiment, the access/sense lines 12 and 16 extend along a first direction, and the access/sense lines 14 extend along a second direction which intersects the first direction. In the illustrated embodiment, access/sense lines 14 extend orthogonally relative to access/sense lines 12 and 16, but in other embodiments the lines 14 may extend along a direction which crosses lines 12 and 16 without being orthogonal to such lines.

The illustrated access/sense lines are straight lines, but in other embodiments they may be wavy or of some other suitable shape.

First memory cells 20 are between the access/sense lines 12 and 14 of the first and second series; and second memory cells 22 are between the access/sense lines 14 and 16 of the second and third series.

The memory cells 20 and 22 comprise programmable materials 21 and 23, respectively, and may comprise any suitable configuration. In some embodiments, the memory cells 20 and 22 may comprise phase change material, such as a chalcogenide-type material (for instance, a material comprising germanium in combination with one or more of antimony, tellurium, sulfur and selenium; a material comprising indium in combination with one or more of antimony, germanium, tellurium, sulfur and selenium; etc.). The programmable material may, for example, comprise, consist essentially of, or consist of GeSbTe or InGeTe; where the formulas indicate the components within the listed compounds, rather than designating specific stoichiometries of such components. For example, the programmable material may comprise germanium, antimony and tellurium; and may correspond to a chalcogenide commonly referred to as GST.

The programmable materials 21 and 23 may be identical to one another in some embodiments; and may differ from one another in other embodiments. For instance, in some embodiments material 23 may differ from material 21 in one or both of composition and thickness.

The first memory cells 20 form a first memory array deck $D_1$, and the second memory cells 22 form a second memory array deck $D_2$. The first memory array deck $D_1$ is within a first tier $T_1$ which comprises the memory cells 20 and the access/sense lines 12 and 14 utilized for writing to and reading from the memory cells. The second memory array deck $D_2$ is within a second tier $T_2$ which comprises the memory cells 22 and the access/sense lines 14 and 16 utilized for writing to and reading from the memory cells. In the shown embodiment, the access/sense line 14 is shared between the tiers $T_1$ and $T_2$.

The second memory array deck $D_2$ differs from the first memory array deck $D_1$ in one or more operating characteristics so that the first and second memory array decks may have different applications. For instance, the second memory deck may have faster access times than the first memory array deck, and may be more suitable for XIP applications and/or DRAM-emulation applications, while the first memory array deck may have better endurance and be more suitable for long-term data storage applications.

Multiple structures and materials may be provided between the memory cells and the access/sense lines, as discussed in more detail below with reference to FIGS. 6A and 6B. Such structures and materials are not specifically illustrated in FIGS. 1, 1A and 1B. Example structures and materials that may be provided between the memory cells and the access/sense lines include insulative materials, select devices, electrodes, heater devices, etc.

Dielectric regions 26 are between horizontally adjacent memory cells. In the shown embodiment, the dielectric regions are the same within both of the tiers $T_1$ and $T_2$, but in other embodiments the dielectric regions may vary from one tier to another. Example dielectric regions are described in more detail with reference to FIGS. 6A and 6B.

Figure 2:
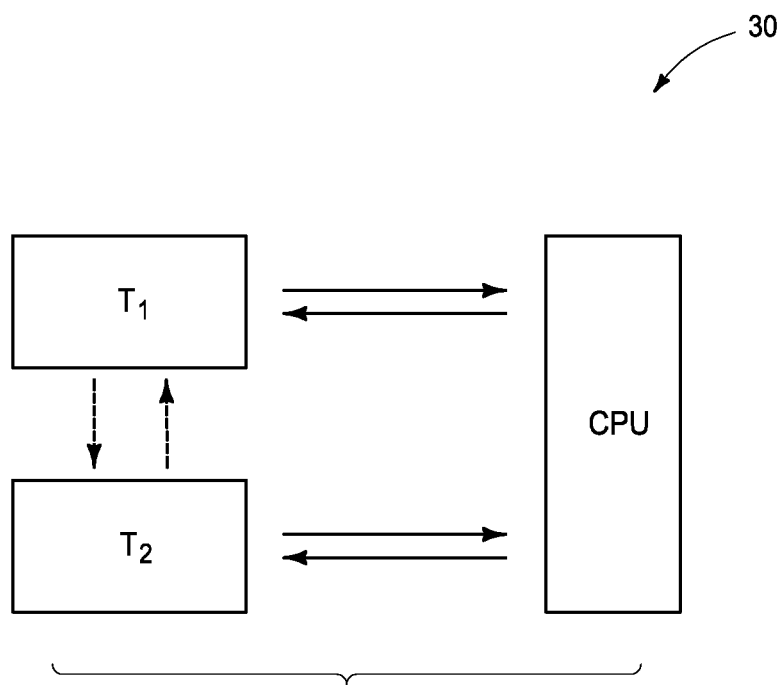
FIG. 2 is a diagrammatic schematic of example electrical flow relative to an example memory tier arrangement.

The tiers $T_1$ and $T_2$ may be electrically accessed through any suitable configuration. FIG. 2 illustrates an example configuration 30. Specifically, each of the tiers $T_1$ and $T_2$ is independently addressable by a central processing unit (CPU), or controller. One or more memory interfaces (not shown) may be between the CPU and the tiers. In some embodiments, data transfer may occur between the tiers.

Figure 3:
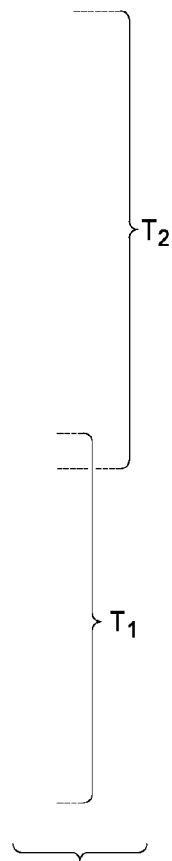
FIGS. 3-5 are diagrammatic illustrations of example memory array deck stacking arrangements.
Figure 4:
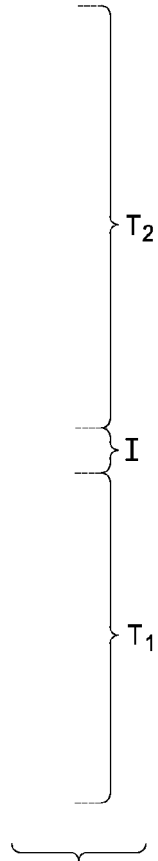

The embodiment of FIGS. 1, 1A and 1B is an example configuration comprising two vertically-stacked decks, and other configurations may be utilized in other embodiments. FIG. 3 diagrammatically illustrates the configuration of FIGS. 1, 1A and 1B, and shows the tiers $T_1$ and $T_2$ vertically overlapping one another (i.e., sharing a series of access/sense lines). FIG. 4 diagrammatically illustrates an alternative configuration where the tiers are vertically spaced from one another by insulative material (I). In the embodiment of FIG. 4, no series of access/sense lines is shared between the tiers. Instead, each tier comprises a memory array deck between a lower series of access/sense lines and an upper series of access/sense lines. Thus, the embodiment of FIG. 4 comprises two tiers with four vertically-stacked series of access/sense lines, whereas the embodiment of FIG. 3 comprises two tiers with three vertically-stacked series of access/sense lines. The configuration of FIG. 3 may be preferred in some embodiments in that it can save processing steps relative to that of FIG. 4. In other embodiments, the configuration of FIG. 4 may be preferred in that it enables performance of the upper tier to be isolated from the performance of the lower tier.

Figure 5:
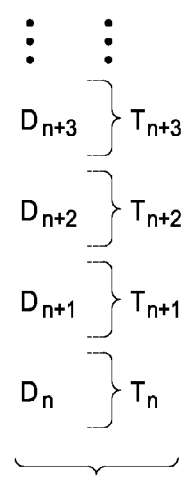

In some embodiments there may be more than two vertically-stacked memory decks. FIG. 5 illustrates an example embodiment in which there is a plurality of vertically-stacked memory array decks ($D_n$, $D_{n+1}$, etc.). The uppermost illustrated deck is $D_{n+3}$, but dots are provided to indicate that the vertical stack of decks may continue beyond such deck.

In some embodiments, at least one deck has different operating characteristics relative to another of the decks within the vertical stack of FIG. 5. The decks having different operating characteristics relative to one another may be anywhere within the vertical stack of memory array decks. In some embodiments, two or more of the memory array decks within the vertical stack of FIG. 5 may have the same operating characteristics as one another; and in other embodiments all of the memory array decks within the vertical stack of FIG. 5 may have unique operating characteristics relative to each of the other memory array decks within the vertical stack.

Referring to FIGS. 6A and 6B, a construction 10a is shown in cross-sectional side views to illustrate additional example architecture.

The construction 10a comprises the memory cells 20 of memory array deck $D_1$, and the memory cells 22 of memory array deck $D_2$. The construction 10a also comprises the first series of access/sense lines 12, the second series of access/sense lines 14, and the third series of access/sense lines 16.

In the shown embodiment, the access/sense lines 12 and 14 both comprise a single material, such as, for example, tungsten. The access/sense lines 16 comprise a pair of materials 40 and 42. The material 40 may be the same material as is utilized in lines 12 and 14; and may, for example, comprise tungsten. The material 42 may be a low resistance material, such as, for example, copper. The combination of materials 40 and 42 may enable lines 16 to have lower resistance than the lines 12 and 14 which may improve access to memory cells of deck $D_2$ relative to those of deck $D_1$. It may be easier to form the lines 16 of the topmost series to be multi-material lines as compared to the lines 12 and 14 of lower series due to additional process control available when forming the topmost series of lines. However, in other embodiments processes may be utilized which enable lines 12 and/or 14 to be formed of multiple materials analogous to the illustrated lines 16. Also, although it may be advantageous for material 42 to comprise lower resistance than material 40, in other embodiments material 42 may comprise a similar resistance as material 40; but the increased thickness of the combined materials 40/42 relative to individual material 40 may enable the combined materials to have lower resistance than the individual material.

The material 42 may be part of metallization provided over the top deck $D_2$ and utilized for coupling circuitry of such top deck (for instance, memory cells 22) with other circuitry peripheral to the memory array of the top deck (such other circuitry may comprise, for example, logic circuitry utilized for addressing memory cells within the top deck). The metallization may be formed with a high degree of freedom due to such metallization being formed over the top deck as opposed to being formed between decks, and accordingly may comprise high conductivity material arranged in a desired configuration.

The decks $D_1$ and $D_2$ are within tiers $T_1$ and $T_2$ analogous to the tiers described above with reference to FIGS. 1, 1A and 1B.

Memory cells 20 and 22 comprise the programmable materials 21 and 23 described above with reference to FIGS. 1, 1A and 1B. Such programmable materials may be formed to any suitable thicknesses, such as, for example, thicknesses within a range of from about 5 nanometers (nm) to about 50 nm.

In the shown embodiment, the deck $D_1$ comprises programmable material 21 in a stack 50 between an access/sense line 12 and an access/sense line 14. Such stack includes a bottom electrode 52, a select device 54, a middle electrode 56, an interface 58, another interface 60, and a top electrode 62.

The electrodes 52, 56 and 62 may comprise any suitable compositions or combinations of compositions. The electrodes may be the same composition as one another in some embodiments, and may differ in composition from one another in other embodiments. In some embodiments, the electrodes may comprise one or more of titanium, aluminum, carbon and tungsten. For instance, the electrodes may comprise, consist essentially of, or consist of one or more of TiSiN, TiAlN, TiN, WN, Ti, C and W; where the formulas indicate the components within the listed compounds, rather than designating specific stoichiometries of such components. The electrodes may be formed to any suitable thicknesses, such as, for example, thicknesses within a range of from about 5 nm to about 50 nm.

In some embodiments, the electrode 56 and interface 58 may be replaced with a "heater" utilized to thermally induce a phase change within the programmable material. Such heater may, for example, consist essentially of, or consist of, TiSiN (where the formula indicates the components within the listed compound, rather than designating a specific stoichiometry of such components).

The select device 54 may correspond to any suitable selecting device. In some embodiments, the select device may correspond to an ovonic threshold switch (OTS). The OTS may comprise any suitable composition or combination of compositions; and in some embodiments may comprise, consist essentially of, or consist of one or more of germanium, arsenic, selenium, tellurium and silicon. For instance, the OTS may comprise, consist essentially of, or consist of AsSe, AsSeGe, AsSeGeTe or AsGeTeSi; where the formulas indicate the components within the listed compounds, rather than designating specific stoichiometries of such components. The OTS may be formed to any suitable thickness, such as, for example, a thickness within a range of from about 5 nm to about 50 nm.

The interfaces 58 and 60 may comprise any suitable materials to interface between the electrodes and the programmable material 21. In some embodiments, the interfaces may comprise carbon, which may or may not be doped; and/or may comprise tungsten. The interfaces may be formed to any suitable thicknesses, such as, for example, thicknesses within a range of from about 1 nm to about 10 nm. In some embodiments one or both of the interfaces may be omitted if the programmable material is compatible with being directly against an electrode material.

In the shown embodiment, the deck $D_2$ comprises programmable material 23 in a stack 70 between an access/sense line 14 and an access/sense line 16. Such stack includes a bottom electrode 72, a select device 74, a middle electrode 76, an interface 78, another interface 80, and a top electrode 82.

The electrodes 72, 76 and 82 may comprise the same compositions and thicknesses described above relative to electrodes 52, 56 and 62. In some embodiments, the electrodes 72, 76 and 82 may comprise one or more of titanium, aluminum, carbon and tungsten. For instance, the electrodes may comprise, consist essentially of, or consist of one or more of TiSiN, TiAlN, TiN, WN, Ti, C and W; where the formulas indicate the components within the listed compounds, rather than designating specific stoichiometries of such components. The electrodes 72, 76 and 82 may be the same composition as one another in some embodiments, and may differ in composition from one another in other embodiments The select device 74 may correspond to any suitable selecting device. In some embodiments, the select device may correspond to an ovonic threshold switch (OTS). The OTS may comprise any suitable composition or combination of compositions; and in some embodiments may comprise, consist essentially of, or consist of one or more of germanium, arsenic, selenium, tellurium and silicon. For instance, the OTS may comprise, consist essentially of, or consist of AsSe, AsSeGe, AsSeGeTe or AsGeTeSi; where the formulas indicate the components within the listed compounds, rather than designating specific stoichiometries of such components. The OTS may be formed to any suitable thickness, such as, for example, a thickness within a range of from about 5 nm to about 50 nm.

The interfaces 78 and 80 may comprise any suitable materials to interface between the electrodes and the programmable material 23. In some embodiments, the interfaces may comprise carbon, which may or may not be doped; and/or may comprise tungsten. The interfaces may be formed to any suitable thicknesses, such as, for example, thicknesses within a range of from about 1 nm to about 10 nm. In some embodiments one or both of the interfaces may be omitted if the programmable material is compatible with being directly against an electrode material.

In some embodiments, one of the electrodes 76 and 82, and an adjacent interface, may be replaced with a "heater" utilized to thermally induce a phase change within the programmable material 23. Such heater may, for example, consist essentially of, or consist of, TiSiN (where the formula indicates the components within the listed compound, rather than designating a specific stoichiometry of such components).

In some embodiments, access/sense lines 14 may be bitlines; and access/sense lines 12 and 16 may be wordlines. The select devices 54 of the lower deck $D_1$ are between the wordlines 12 and the memory cells 20, whereas the select devices 74 of the upper deck $D_2$ are between the bitlines 14 and the memory cells 22. Accordingly, the decks are asymmetric relative to one another. The illustrated asymmetric embodiment may be advantageous in that it may simplify patterning and etching of the select devices 74 of the upper deck $D_2$ as compared to symmetric embodiments in which the select devices of the upper deck are placed between wordlines 16 and memory cells 22. However, in some applications it may be desirable to utilize a symmetric embodiment instead of the illustrated asymmetric embodiment.

The tier $T_1$ comprises first dielectric regions 100 laterally between adjacent stacks 50, and similarly the tier $T_2$ comprises second dielectric regions 102 laterally between adjacent stacks 70. The dielectric regions 100 comprise first insulative material liners 101 along sidewalls of stacks 50 (and specifically along sidewalls of structures 20, 52, 54, 56, 58, 60 and 62), and similarly the dielectric regions 102 comprise second insulative material liners 103 along sidewalls of stacks 70 (and specifically along sidewalls of structures 22, 72, 74, 76, 78, 80 and 82). The dielectric regions 100 comprise a first insulator 104 between the first insulative material liners 101, and similarly the dielectric regions 102 comprise a second insulator 106 between the second insulative material liners 103.

Although the dielectric region 100 is shown to be identical in the cross-section of FIG. 6A as in that of FIG. 6B, in other embodiments the insulative materials utilized in the dielectric region 100 along one of the cross-sections may be different than those utilized along the other of the cross-sections. Similarly, the insulative materials utilized in the dielectric region 102 along the cross-section of FIG. 6A may be identical to those utilized along the cross-sectional of FIG. 6B (as shown), or may be different in other embodiments.

Insulative material liners 101 and 103 may comprise any suitable compositions or combination of compositions; and in some embodiments may comprise, consist essentially of, or consist of one or both of silicon nitride and aluminum oxide.

The insulators 104 and 106 may comprise any suitable compositions or combinations of compositions.

In some embodiments, insulator 104 may comprise a solid or semisolid material; and may, for example, comprise, consist essentially of, or consist of silicon dioxide. In some embodiments, insulator 104 may correspond to spin-on dielectric.

The insulator 106 may comprise a same material as insulator 104 in some embodiments. In other embodiments, insulator 106 may comprise a different material than insulator 104. For instance, in some embodiments insulator 106 may comprise gas, such as, for example, air. In some embodiments, insulator 106 may comprise a low-pressure (i.e., vacuum) region.

As discussed above, it may be desired for the memory array of deck $D_2$ to have different operational characteristics relative to the memory array of deck $D_1$. Such difference in operational characteristics may reflect different structural parameters of one or more components of deck $D_2$ relative to those of deck $D_1$. For instance, one or more materials within stack 70 of deck $D_2$ may have a different composition or thickness relative to analogous material within stack 50 of deck $D_1$. The difference in thickness may be ±5%, ±10%, ±20%, ±100%, etc. Additionally, or alternatively, one or more materials of deck $D_2$ may have a different composition relative to an analogous material of deck $D_1$; with such difference in composition being, for example, a different stoichiometry, different dopant concentration, etc. For instance, an electrode of one of the decks may comprise Ti, while an analogous electrode of the other deck may comprise W and/or carbon. Additionally, or alternatively, one of the decks may comprise one or more entirely different structures than the other of the decks. For instance, one of the decks may comprise a heater adjacent the phase change material, while the other of the decks has no heater adjacent analogous phase change material.

In some example embodiments the programmable material 23 of memory cells 22 may be a different composition or thickness as compared to the programmable material 21 of memory cells 20. For instance, the programmable material 23 may be configured to have faster switching characteristics than programmable material 21. Such faster switching characteristics may be achieved by making programmable material 23 thinner than programmable material 21 and/or by altering a composition of material 23 relative to material 21. For instance, both of materials 23 and 21 may comprise GST, but one may be doped relative to the other to change the relative switching characteristics of the materials.

In some example embodiments, selecting devices 54 may comprise a different configuration than selecting devices 74. For instance, material utilized in selecting devices 54 may be different in composition than that utilized in selecting devices 74 and/or the material utilized in selecting devices 54 may differ in thickness relative to material utilized in selecting devices 74. Such difference in characteristics between selecting devices 54 relative to devices 74 may enable faster switching characteristics of memory cells 22 relative to memory cells 20 in some applications. However, such faster switching characteristics may be accompanied by increased leakage. Accordingly, the faster switching characteristics may be suitable for some applications, while the memory cells having slower switching characteristics and lower leakage may be suitable for other applications.

In some embodiments, dielectric regions 102 of deck $D_2$ may differ from dielectric regions 100 of deck $D_1$. For instance, insulative material liners 103 may have a different composition or thickness as compared to insulative material liners 101. For instance, in some embodiments the thickness of the insulative material liners 103 may differ from that of the liners 101 by more than 2 nm, more than 5 nm, etc. Such may change structural characteristics of dielectric regions 100 relative to dielectric regions 102 to tailor the dielectric regions for particular applications. For instance, since dielectric region 100 supports the materials of deck $D_2$, it may be desired that dielectric region 100 be resistant to crush. Accordingly, it may be desired that the liners 101 be formed relatively thick, particularly if insulator 104 is a softer material than that utilized in the liners. Further, it may be desired that material 104 provide crush-resistance, and accordingly that it be solid or semisolid (for instance, silicon dioxide and/or silicon nitride). In contrast, since tier $T_2$ is an uppermost tier in the illustrated embodiment, there may be more freedom in choosing the materials of dielectric region 102. Accordingly, liners 103 may be formed to be thin in comparison to the liners 101 and/or insulator 106 may be formed to have less crush-resistance than the insulator 104. For instance, in some embodiments the insulator 106 may comprise gas. In some embodiments, insulator 106 may comprise a low-pressure (i.e., vacuum) region. In some embodiments, insulator 106 may comprise low-k dielectric material (i.e., material having a dielectric constant less than that of silicon dioxide). In some embodiments, a reason for providing an air gap (or vacuum) in only an uppermost deck may be related to the relative ease of fabricating such in the uppermost deck as compared to lower decks in addition to, or alternatively to, being related to any structural advantage or disadvantage pertaining to the air gap (or vacuum). In some embodiments, a reason for avoiding formation of air gaps (or vacuum) as insulative material in lower decks may be related to additional process steps that the lower decks are subjected to (for instance, chemical-mechanical polishing) in addition to, or alternatively to, other reasons.

The differences between the insulator regions 100 and the insulator regions 102 may lead to variation of the performance characteristics of memory within the memory array deck $D_1$ as compared to memory within the memory array deck $D_2$. For instance, one of the decks may be more resistant to thermal disturb (or other mechanisms of crosstalk between adjacent memory cells) than the other.

In the illustrated embodiment of FIGS. 6A and 6B, the dielectric regions 102 extend downwardly between access/ sense lines 14 (as shown in FIG. 6A). Accordingly, if insulator 106 comprises gas, such is laterally between access/sense lines 14 (e.g., bitlines in some embodiments). In other embodiments, the dielectric regions 100 may extend upwardly to be between the access/sense lines 14, rather than having the dielectric regions 102 extend downwardly to be between such access/sense lines.

In the illustrated embodiment, additional dielectric material 110 is provided beneath access/sense lines 12, and additional dielectric material 112 is provided between the material 42 of access/sense lines 16. The materials 110 and 112 may comprise any suitable compositions or combinations of compositions; and in some embodiments may comprise one or both of silicon nitride and silicon dioxide. The materials 110 and 112 may be the same composition as one another, or may be different compositions relative to one another.

In some embodiments, deck $D_2$ represents an uppermost memory array deck in a stack of memory array decks (for instance the stack of FIG. 5). There may be additional degrees of freedom available for fabricating the uppermost memory array deck as compared to other decks deeper in the stack of memory array decks, and materials of such uppermost deck may experience a lower thermal budget as compared to materials of decks deeper in the stack. Accordingly, the uppermost memory array deck may have better uniformity of cell behavior and more choices of materials as compared to other decks of the stack; which may enable the uppermost deck to have wider program and read margins than other decks of the stack. This may further enable the uppermost memory array deck to be more readily tailored for some purposes than other memory array decks of the stack, which may be a further advantage of utilizing the uppermost memory array deck for different purposes than other memory array decks of the stacked decks. In other embodiments, other decks (in addition to or besides the uppermost deck) may be tailored for different purposes than decks beneath them in the stacked memory array decks.

Figure 7:
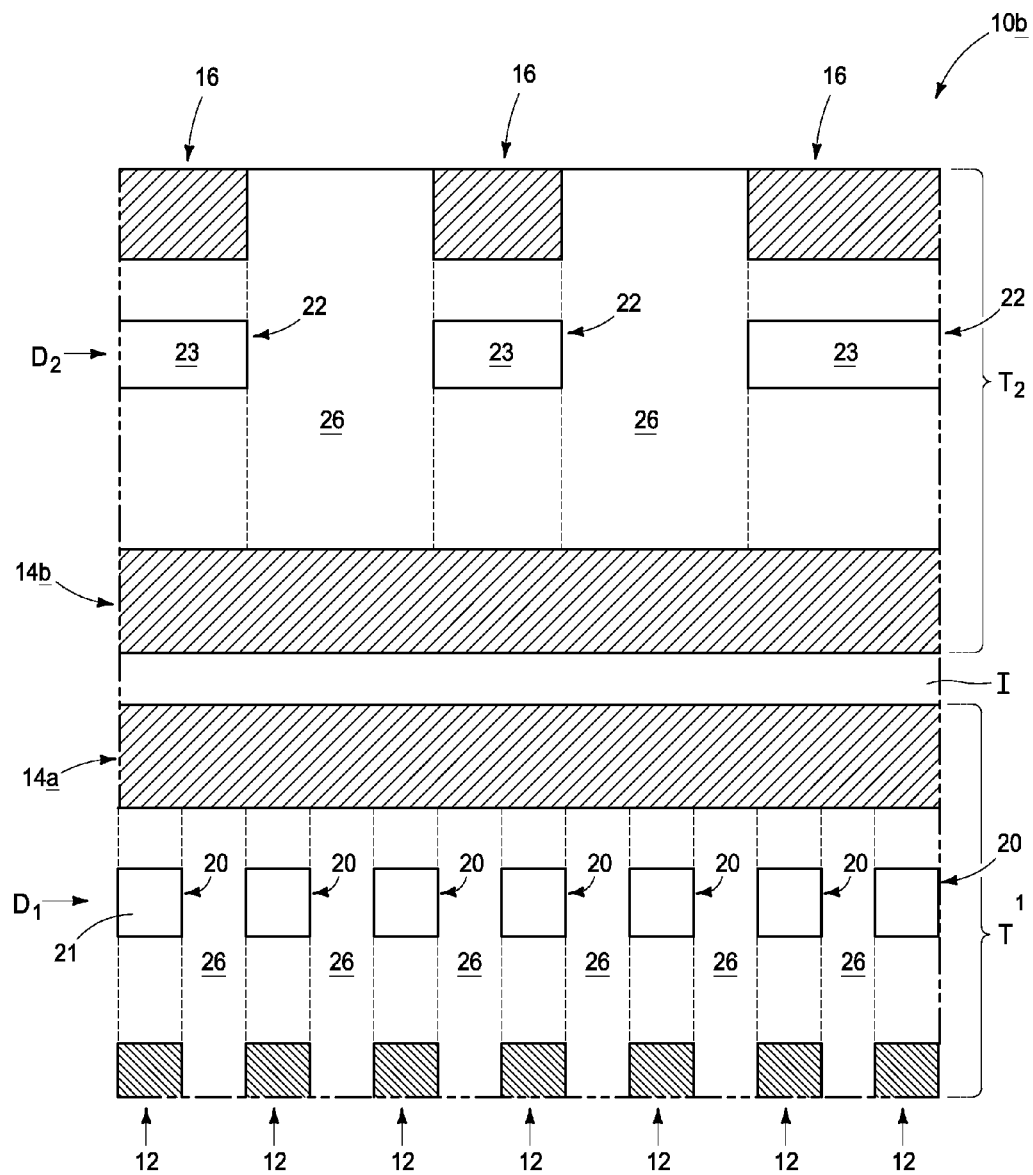
FIG. 7 is a cross-sectional side view of a portion of an example embodiment construction.
Figure 8:
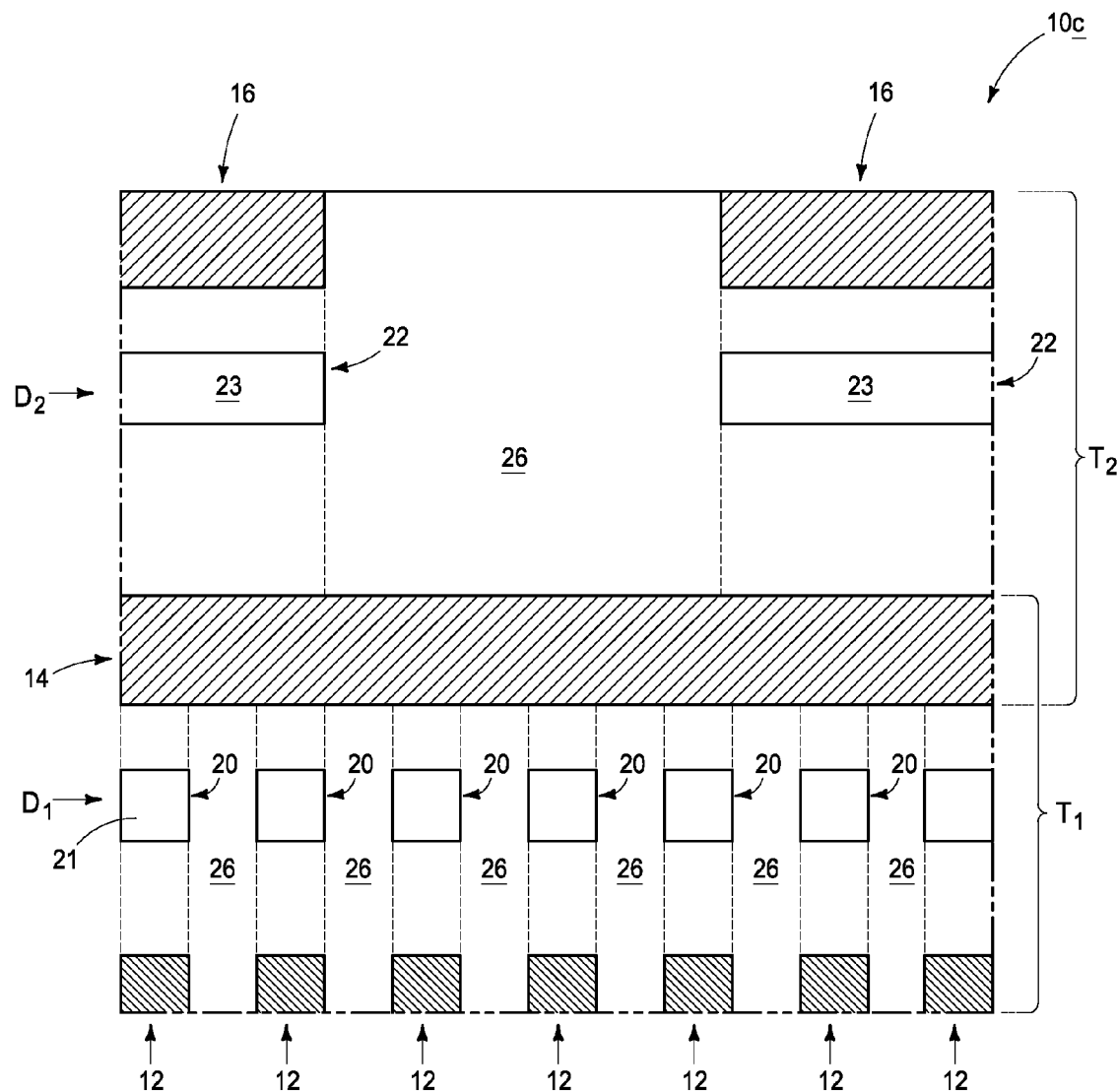
FIG. 8 is a cross-sectional side view of a portion of an example embodiment construction.

In addition to, or alternatively to, differences between materials, structures and thicknesses within a memory array decks, there may be differences in pitch or other patterning characteristics. The difference in pitch may be along the x-direction (i.e., x-axis), y-direction (i.e., y-axis), or both. For instance, FIGS. 7 and 8 show constructions 10b and 10c, respectively, illustrating embodiments in which there is a different pitch utilized for an upper tier memory array deck relative to a lower tier memory array deck. In each embodiment, the upper tier deck $D_2$ has a larger pitch than the lower tier deck $D_1$. But in other embodiments such may be reversed. The constructions of FIGS. 7 and 8 are illustrated similarly that of FIG. 1, and may comprise any of the structures described above with reference to FIGS. 1, 1A, 1B, 6A and 6B. Notably, FIG. 7 shows a construction in which the tiers $T_1$ and $T_2$ do not share a series of access/sense lines. Rather, the access/sense line 14 of FIGS. 1B and 6B is replaced with two access/sense lines 14a and 14b which are vertically spaced from one another by insulative material I. Such insulative material may comprise any suitable composition or combination of compositions; and in some embodiment may comprise one or both of silicon dioxide and silicon nitride. The configuration of FIG. 7 is an example of the configuration described above with reference to FIG. 4.

The difference in pitch of one deck relative to another may be any suitable difference. For instance, in some embodiments the pitch of memory cells of one deck may be doubled relative to the pitch of memory cells of an immediately adjacent deck while maintaining the same cell dimensions in each deck. Accordingly, every other access/sense line of one deck is not utilized by the immediately adjacent deck. The access/sense lines may be bitlines and/or wordlines; depending on whether the difference in pitch is along the x-direction, y-direction, or both.

Advantages of relaxed pitch for a deck may include, for example, increased cell space, reduced thermal disturb, etc. Such advantages are achieved at the expense of cell density; but may be desirable in some applications (for instance, high-temperature environments, extreme long-term storage, etc.)

The architectures discussed above may be used in any of a broad range of electronic systems, such as, for example, clocks, televisions, cell phones, personal computers, automobiles, industrial control systems, aircraft, etc. For instance, the architectures discussed above may be utilized in automobiles or other applications in which a chip containing memory may be exposed to substantial heat during operation. A memory chip may be oriented so that outer memory array decks are exposed to higher thermal stresses than inner memory array decks, and accordingly the outer memory array decks may be configured specifically for resistance to such thermal stresses while the inner memory array decks are configured for optimal performance at more reasonable temperatures.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a construction which comprises a first memory array deck and a second memory array deck over the first memory array deck. The first and second memory decks comprise phase change memory, and the second memory array deck differs from the first memory array deck in one or more operating characteristics.

Some embodiments include a construction which comprises a first memory array deck and a second memory array deck over the first memory array deck. The second memory array deck comprises a different pitch than the first memory array deck.

Some embodiments include a construction which comprises a first memory array deck and a second memory array deck over the first memory array deck. The second memory array deck differs from the first memory array deck in one or more structural parameters; with said structural parameters including different materials and/or different thicknesses of materials.

Some embodiments include a construction which comprises a first series of access/sense lines extending along a first direction, a second series of access/sense lines over the first series of access/sense lines and extending along a second direction which crosses the first direction, and a third series of access/sense lines over the second series of access/sense lines and extending along the first direction. First memory cells are between the first and second series of access/sense lines and comprise first phase change material. The first memory cells are arranged in a first memory array deck. Second memory cells are between the second and third series of access/sense lines and comprise second phase change material. The second memory cells are arranged in a second memory array deck. The second memory array deck differs from the first memory array deck in one or more operating characteristics.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A construction, comprising:
a first memory array deck;
a second memory array deck over the first memory array deck;
wherein the first and second memory array decks comprise phase change memory, and wherein the second memory array deck differs from the first memory array deck in one or more operating characteristics; and
wherein:
memory cells of the first memory array deck are laterally spaced from one another by first dielectric regions along a cross-section;
memory cells of the second memory array deck are laterally spaced from one another by second dielectric regions along the cross-section; and
the first dielectric regions differ from the second dielectric regions in one or more structural parameters; with said structural parameters including different materials and/or different thicknesses of materials.

2. The construction of claim 1 wherein:
the first dielectric regions comprise first insulative material liners along sidewalls of memory cells;
the second dielectric regions comprise second insulative material liners along sidewalls of memory cells; and
the first insulative material liners are different thicknesses than the second insulative material liners.

3. The construction of claim 1 wherein:
the first dielectric regions comprise first insulative material liners along sidewalls of memory cells;
the second dielectric regions comprise second insulative material liners along sidewalls of memory cells; and
the first insulative material liners are different compositions than the second insulative material liners.

4. The construction of claim 1 wherein:
the first dielectric regions comprise first insulative material liners along sidewalls of memory cells;
the first dielectric regions comprise a first insulator between the first insulative material liners;
the second dielectric regions comprise second insulative material liners along sidewalls of memory cells;
the second dielectric regions comprise a second insulator between the second insulative material liners; and
wherein the second insulator is a different composition relative to the first insulator.

5. The construction of claim 4 wherein:
the first insulator is solid and/or semisolid; and
the second insulator is gas.

6. The construction of claim 4 wherein:
the first and second insulative material liners comprising silicon nitride;
the first insulator comprises silicon dioxide; and
the second insulator is gas.

7. The construction of claim 4 wherein:
the first and second insulative material liners comprising silicon nitride;
the first insulator comprises silicon dioxide; and
the second insulator is a vacuum region.

8. A construction, comprising:
a first memory array deck;
a second memory array deck over the first memory array deck;
wherein the second memory array deck differs from the first memory array deck in one or more structural parameters; with said structural parameters including different materials and/or different thicknesses of materials; and
wherein:
first memory cells of the first memory array deck are laterally spaced from one another by first dielectric regions along a cross-section;
second memory cells of the second memory array deck are laterally spaced from one another by second dielectric regions along the crosssection; and
the first dielectric regions differ from the second dielectric regions in said one or more structural parameters.

9. The construction of claim 8 wherein:
the first dielectric regions comprise first insulative material liners along sidewalls of the first memory cells;
the second dielectric regions comprise second insulative material liners along sidewalls of the second memory cells; and
the first insulative material liners are different thicknesses than the second insulative material liners.

10. The construction of claim 8 wherein:
the first dielectric regions comprise first insulative material liners along sidewalls of the first memory cells;
the second dielectric regions comprise second insulative material liners along sidewalls of the second memory cells; and the first insulative material liners are different compositions than the second insulative material liners.

11. The construction of claim 8 wherein:
the first dielectric regions comprise first insulative material liners along sidewalls of the first memory cells;
the first dielectric regions comprise a first insulator between the first insulative material liners;
the second dielectric regions comprise second insulative material liners along sidewalls of the second memory cells;
the second dielectric regions comprise a second insulator between the second insulative material liners; and
wherein the second insulator is a different composition relative to the first insulator.

12. A construction, comprising:
a first series of access/sense lines extending along a first direction;
a second series of access/sense lines over the first series of access/sense lines and extending along a second direction which crosses the first direction;
a third series of access/sense lines over the second series of access/sense lines and extending along the first direction;
first memory cells between the first and second series of access/sense lines, the first memory cells being arranged in a first memory array deck and comprising first phase change material;
second memory cells between the second and third series of access/sense lines, the second memory cells being arranged in a second memory array deck and comprising second phase change material;
wherein the second memory array deck differs from the first memory array deck in one or more operating characteristics; and
wherein:
the first memory cells are laterally spaced from one another by first dielectric regions along a cross-section;
the second memory cells are laterally spaced from one another by second dielectric regions along the cross-section; and
the first dielectric regions differ from the second dielectric regions in one or more structural parameters with said structural parameters including different materials and/or different thicknesses of materials.

13. The construction of claim 12 wherein:
the first dielectric regions comprise first insulative material liners along sidewalls of the first memory cells;
the second dielectric regions comprise second insulative material liners along sidewalls of the second memory cells; and
the first insulative material liners are different thicknesses than the second insulative material liners and/or are different compositions than the second insulative material liners.

14. The construction of claim 12 wherein:
the first dielectric regions comprise first insulative material liners along sidewalls of the first memory cells;
the first dielectric regions comprise a first insulator between the first insulative material liners;
the second dielectric regions comprise second insulative material liners along sidewalls of the second memory cells;
the second dielectric regions comprise a second insulator between the second insulative material liners; and
wherein the second insulator is a different composition relative to the first insulator.

* * * * *